| United States Patent [19] | [11] | 4,016,567 |
|---|---|---|
| Buss | [45] | Apr. 5, 1977 |

[54] CCD RANGE-DOPPLER PROCESSOR

[75] Inventor: Dennis Darcy Buss, Cambridge, Mass.

[73] Assignee: Texas Instruments Incorporated, Dallas, Tex.

[22] Filed: Nov. 6, 1975

[21] Appl. No.: 629,246

Related U.S. Application Data

[62] Division of Ser. No. 483,337, June 24, 1974, Pat. No. 3,942,035.

[52] U.S. Cl. .............................. 343/7.7; 343/5 DP
[51] Int. Cl.² .......................................... G01S 9/42
[58] Field of Search ......................... 343/7.7, 5 DP

[56] References Cited
UNITED STATES PATENTS

| 3,720,950 | 3/1973 | Vehrs | 343/5 DP |
| 3,787,852 | 1/1974 | Pockette et al. | 343/7.7 |

*Primary Examiner*—Maynard R. Wilbur
*Assistant Examiner*—Richard E. Berger
*Attorney, Agent, or Firm*—Harold Levine; Rene' Grossman; Richard L. Donaldson

[57] ABSTRACT

Signal processing wherein signals are processed using chirp-Z-transform (CZT) techniques and charge transfer device (CTD) transversal filters. The chirp weighting signal may be amplitude modulated to achieve signal apodization and may be generated by impulsing a CTD complex filter having an appropriate impulse response. Signal premultiplication using a one-bit quantized chirp signal is described.

Application of these techniques to doppler range processing apparatus wherein radar returns are premultiplied to provide up-chirp multiplied time samples prior to being inputted into a CTD range buffer. Each bit of the CTD has an associated CTD chirp Z-transform complex filter the outputs from each of which are summed and squared. The range bins and the associated complex filters are provided on a common semiconductor chip together with peripheral circuitry.

13 Claims, 12 Drawing Figures

EXAMPLE OF A CHIRP PRE-MULTIPLYING SIGNAL

Fig. 10

EXAMPLE OF FIGURE 9 MODIFIED BY 1-BIT QUANTIZATION

CCD RANGE-DOPPLER PROCESSOR

This is a division of application Ser. No. 483,337, filed June 24, 1974, now U.S. Pat. No. 3,942,035.

This invention relates to signal processing involving chirp-Z-transform (CZT) techniques. In one particular application of such techniques, the invention relates to apparatus particularly suitable for use in a radar range-doppler processor incorporating charge transfer devices, such as may be used in a moving target radar system. Operating principles of such systems are described in "Introduction To Radar Systems", N. I. Skolnik, published by McGraw-Hill Book Co., in particular Chapter 4.

Moving target radar uses the effect of doppler shift to isolate moving targets in the presence of zero doppler clutter as well as to determine the movement characteristics of such target, i.e., the speed and relative direction of movement. Long range radar may receive many returns from many targets. It is desirable that complete information be generated substantially simultaneously for each of the targets.

A source sending a radar signal receives returns at different time intervals from a plurality of targets depending on the relative distance of each target from the source. That is, a close target return will reach the source relatively sooner than a far target return. It is apparent that the returns from a plurality of targets all resulting from one transmission are time sequential and by identifying each target with a time range, one target return may be discriminated from all other target returns.

In order to perform the association of each target with a particular time slot, the time of receipt of the target range of interest may be divided into time bins. Then each time bin may be separately interrogated to determine the characteristics of any targets that may be present. The frequency of the signals within each time bin is indicative of relative movement of source and target, the time bin itself being indicative of location. The frequency carries this information, since it is directly related by a well known relationship to doppler shift and hence to relative movement.

As described in copending application Ser. No. 429,229 filed Dec. 28, 1973 (U.S. Pat. No. 3,942,034 issued Mar. 2, 1976) by Dennis D. Buss, entitled "Charge Transfer Device Range Gate Filter" and commonly assigned, now U.S. Pat. No. 3,942,034, a shift register may be used as a range buffer, the storage bits of the shift register defining the range bins. Radar return signals during a particular pulse repetition interval (PRI) are sampled and clocked into the shift register until the first pulse return has reached the end of the shift register when the shift register clock is stopped, and the data stored in the shift register are transferred out in parallel. Near targets appear in the high numbered range bins while far away targets appear in the low numbered range bins. The parallel outputs from the shift register range bins are processed by respective Discrete Fourier Transform (DFT) filters which take the DFT over $N_t$ hits or returns to determine the doppler shift. If the $N$ hits are $x_1, x_2, \ldots x_n \ldots x_N$ then the DFT determines the Fourier coefficients $X_k$ through the following linear operation:

$$X_k = \sum_{n=1}^{N} x_n e^{-i2\pi nk/N}$$

wherein $k=1 \ldots N$, represents the index on the Fourier coefficients.

The DFT may be computed using a Chirp-Z-Transform (CZT). The signal data extracted from each range bin of the shift register are subjected to CZT filtering involving (1) premultiplication by a chirp waveform, (2) convolution with a chirp waveform and (3) post-multiplication by a chirp waveform. When only the power density spectrum is required, the post-multiplication can be eliminated and the filtering operation is followed by envelope detection. Further description of such processing may be found in "Real Time Discrete Fourier Transforms Using Charge Transfer Devices," R. W. Means, D. D. Buss, and H. J. Whitehouse, "Proceedings of the CCD Applications Conference, Sept. 18–20, 1973 and in "High Speed Serial Access Linear Transform Implementations," H. J. Whitehouse, J. M. Speiser and R. W. Means, All Applications Digital Computer (AADC) Symposium, Orlando, Fla.

Taking into account that the received radar returns are complex signals which are processed to provide in-phase and quadrature components, each requiring separate range buffer storage and CZT filtering as described above, it will be appreciated that realization of the necessary processing apparatus can become complex, particularly for any appreciable number of range bins.

It is an object of the invention to provide improved signal processing using CZT filtering techniques.

It is an object of the present invention to provide simplified signal processing apparatus suitable for use in a range-doppler processor.

It is a further object of the present invention to provide such signal processing apparatus utilizing charge transfer devices to provide range-bin and transverse filtering functions.

In accordance with one aspect of the present invention, signal processing apparatus, suitable for use in a range doppler processing apparatus includes a common semiconductor substrate including charge transfer device shift register means defining a plurality of storage bits (each corresponding to a time range bin) and for each bit there is provided charge transfer device chirp Z-transform means providing in-phase and quadrature-phase convolution of signals outputted in parallel from respective bits of the shift register means.

According to another aspect of the invention, time samples of radar return signals are pre-weighted by an up-chirp weighting function prior to being inputted into the time range buffer shift register means.

For more detail descriptions of embodiments of the invention, together with further advantages thereof, reference is now made to the following description taken in conjunction with the drawings, wherein:

As set forth above, the present invention employs charge transfer devices, which term includes both charge coupled devices and bucket brigade devices. Such devices are utilized as shift registers and as transversal filters in realization of the present invention. As is understood by those skilled in the art, these structures are operable to store and transfer analog signals. Further, charge transfer devices are particularly advantageous in that they are less complex than conventional shift registers and are accordingly less expensive.

Conventional semiconductor fabrication techniques are well documented and need not be repeated herein. In general, a CCD stores charge in potential wells beneath electrodes, and moves charges stored in these wells along from electrode to electrode. By manipulating the charge along a series of electrodes, the CCD functions as a shift register. The basic structure of a three-phase CCD is illustrated in FIG. 1.

Figure 1:
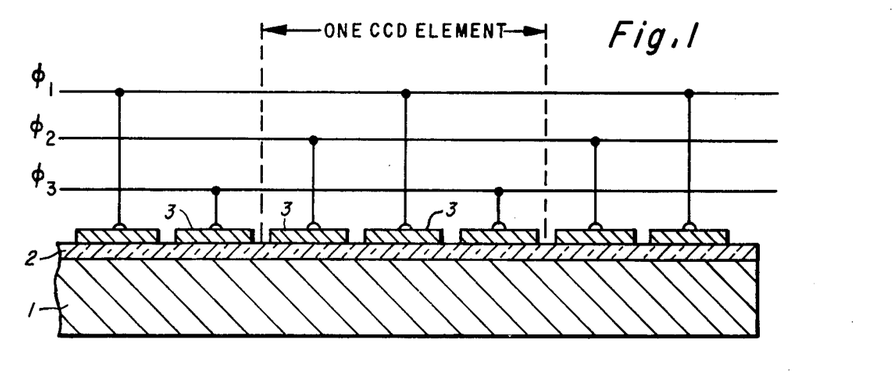
FIG. 1 is a diagrammatic cross-section of a portion of a charge coupled device.

With reference to FIG. 1, a semiconductor substrate is shown at 1. The substrate is typically P-type silicon, but of course other semiconductor materials and conductivity types may be used. A relatively thin insulating layer 2 is formed over one surface of the substrate 1. A particularly suitable insulating material is silicon oxide, generally formed to a thickness of less than 2000A. A series of closely spaced electrodes shown generally at 3 are formed over the insulating layer 2. In the example shown, three electrodes are associated with each element of the CCD but other CCD designs have a different number of electrodes per element, e.g., commonly 2 or 4 electrodes per element. Three-phase clock pulses $\phi_1$, $\phi_2$ and $\phi_3$ are required for operation of the three-phase CCD. When P-type silicon is used for the substrate, the clock voltages are positive. A surface channel CCD is shown in FIG. 1 but buried channel CCD's can also be used.

In operation of the CCD, charge is stored in and transferred between potential wells. In the storage mode of a three-phase CCD, the voltage $\phi_2$ is greater than the bias voltage $\phi_1$, and forms a potential well that "captures" charge from an input diode or from a preceding bit. In the transfer mode, charge moves along to the adjacent electrode when a still larger voltage $\phi_3$ is applied to that electrode, thus creating a larger potential well into which the charge is "dumped."

The bucket brigade charge-transfer device is in essence a row of insulated gate field effect transistors (IGFET) with sources and drains connected and with the gates capacitively coupled to the drains. The basic structure of a BBD is shown in FIG. 2.

Figure 2:
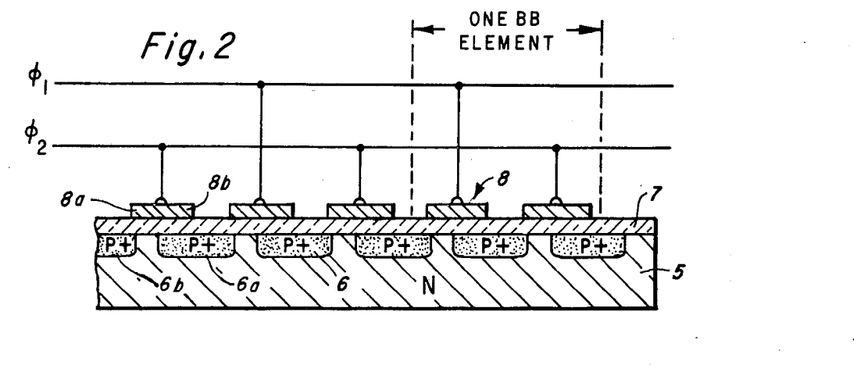
FIG. 2 is a diagrammatic cross-section of a part of a bucket brigade device.

With reference to FIG. 2, a semiconductor substrate, typically N-type silicon, is shown at 5. A series of opposite conductivity type "islands" is formed in the surface of the substrate 5 by well known selective doping techniques. For the example illustrated in FIG. 2 these p+ regions are illustrated at 6, and respectively from source and drain electrodes of IGFETS of the BBD. A relatively thin (generally less than 2000A) insulating layer 7, of, e.g., silicon oxide, is formed over the substrate and opposite conductivity type regions 6. Other insulating materials could be used of course.

Spaced apart conductive gate electrodes 8 are formed over the substrate. Each gate electrode extends over the region of the substrate 5 which lies between two of the P+ islands 6, i.e., the gate extends over the channel region. In the BBD structure, it will be noted, however, that the gate-electrode extends over a significant portion of the drain region of the respective IGFET's. For example, consider the IGFET defined by source 6b, drain 6a (which define storage nodes), and gate 8a. A portion 8b of the gate 8a extends over a significant portion of the drain 6a. This produces an enlarged gate to drain capacitance which is used for charge storage in operation of the BBD.

The BBD device is operated utilizing two clock voltages $\phi_1$ and $\phi_2$. When it is desired to transfer charge from storage node 6b to 6a, the $\phi_2$ clock line is pulsed negative turning on the channel under the gate 8a. Charge then flows from node 6b to node 6a until the magnitude of the potential of node 6b increases to the point where the channel stops conducting. Clock line $\phi_2$ is then pulsed off and clock line $\phi_1$ is pulsed on, initiating charge transfer from the node 6a to the next P+ island.

Figure 3:
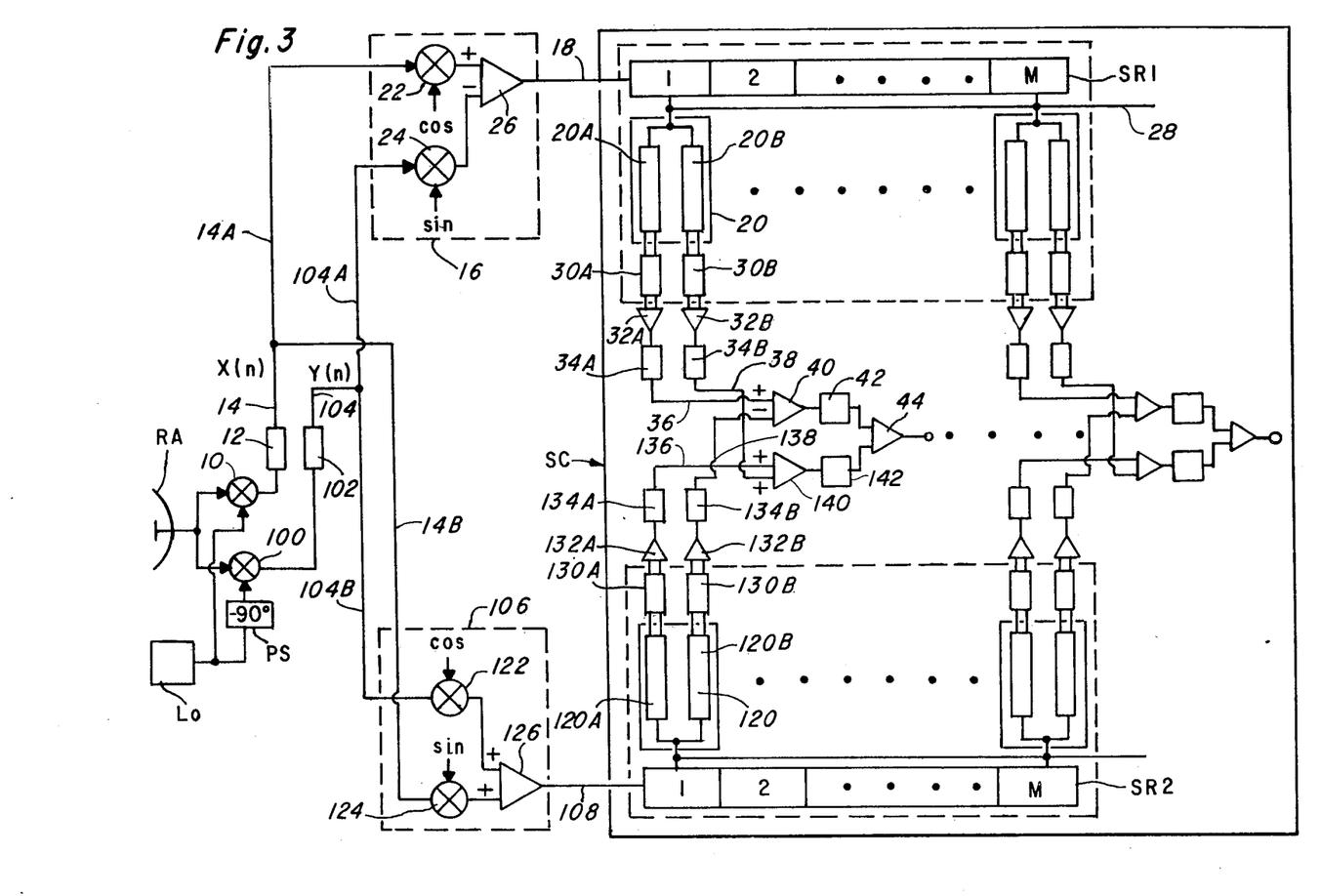
FIG. 3 illustrates range-doppler processing apparatus embodying the invention.

FIG. 3 illustrates radar pulse-doppler apparatus embodying the present invention and incorporating charge transfer devices.

A receiver antenna RA supplies received (return) radar video signals to mixers 10 and 100. A local oscillator $L_0$ supplies a suitable reference frequency signal directly to the mixer 10 and via a −90° phase shifter PS to mixer 100. The mixers 10 and 100 generate difference signals which are sampled at a Nyquist rate corresponding with the pulse repetition frequency (prf) of the radar return signals by conventional sampling devices 12 and 102. The video return signals fed to the mixers 10 and 100 are complex signals and the outputs of the sampling devices 12 and 102 represent the real components [X(n)] and the imaginary components [Y(n)] of the nth sample of the complex signal [Z(n)].

The sampled signals X(n) and Y(n) are fed over lines 14 and 104 to weighting or multiplication devices 16 and 106 for weighting by an appropriately weighted sample of the up-chirp signal. The weighted samples are fed over lines 18 and 108 as inputs to respective charge transfer device (CTD) shift registers SR1 and SR2 each having M bits or range bins for accepting the M range bin samples for one radar pulse repetition interval (PRI). When the M samples of one PRI have been sampled and clocked into the shift registers SR1 and SR2, the stored samples from shift register SR1 are shifted in parallel into M respective CTD chirp Z-transform filters 20 while the store samples from shift register SR2 are shifted in parallel into M respective CTD chirp Z-transform filters 120. This process is repeated for each PRI. The chirped time samples thus propagate through the chirp filters 20 and 120 at a rate of one position per PRI, so that one spectral sample is produced every PRI from the output of each chirp filter. That is, for a given range bin, the spectral samples emerge in sequence with N PRI's required to obtain an N-point spectrum of the radar return input series Z(n).

The up-chirp weighting devices 16 and 106 function to weight the Nyquist samples representing the complex input signal time series Z(n) over the N sequential samples to be processed from the range bins of the shift registers, by a factor proportional to the up-chirp weighting factor $e^{i\pi n^2/N}$ and produce correspondingly weighted real and imaginary components of the signal $Z(n)$. This up-chirp weighting function is more readily appreciated from the following mathematical derivation:

$$Z(n) = X(n) + jY(n)$$

$$Z(n)e^{i\pi n^2/N} = [X(n) + jY(n)]\left[\cos\frac{\pi n^2}{N} + j\sin\frac{\pi n^2}{N}\right]$$

$$= \left[X(n)\cos\frac{\pi n^2}{N} - Y(n)\sin\frac{\pi n^2}{N}\right]$$

$$+ j\left[Y(n)\cos\frac{\pi n^2}{N} + X(n)\sin\frac{\pi n^2}{N}\right]$$

Thus, referring to FIG. 3, in the weighting device 16, the sampled signals $X(n)$ are fed over line 14A to mixer 22 which also receives a signal proportional to Cos ($\pi n^2/N$) and the sampled signals $Y(n)$ are fed over line 104A to mixer 24 which also receives a signal proportional to Sin ($\pi n^2/N$). The outputs from the mixers 22 and 24 are fed as inputs to a difference amplifier 26, the output of which is connected to the line 18. In the mixer 106, $Y(n)$ and $X(n)$ signals are fed over lines 104B and 14B to mixers 122 and 124 which also receive signals proportional to Cos ($\pi n^2/N$) and Sin ($\pi n^2/N$), respectively. The output of the mixers 122 and 124 are fed as inputs to a summation amplifier 126, the output of which is connected to line 108.

The signals on line 18 are inputted into the shift register SR1 via an appropriate input device, e.g., a junction diode, under control of a clock pulse source CPS as known in the art, and then clocked along the shift register by the clock pulse source CPS until the M samples occurring during a PRI have been stored in the respective M bits of the shift register. As previously noted, the shift register may be a CCD or a BBD. Then, the clock pulse source CPS applies a transfer signal to the parallel transfer electrode 28 to transfer out in parallel the charge samples (signal data) stored in each of the M bits of the shift register as inputs to the respective chirp transversal filters 20. (Suitable parallel transfer methods are well known and will not be described herein.)

Each transversal filter in fact comprises two parallel chirp-transversal filters, one of which 20A weights the signals clocked through it by the clock pulse source CPS, by an in-phase weighting factor proportional to Cos ($\pi n^2/N$) while the other transversal filter 20B weights the signals clocked through it, also by the clock pulse source CPS, by a quadrature-phase weighting factor proportional to Sin ($\pi n^2/N$). The outputs from the filters 20A and 20B are proportional to $R_m \otimes$ Cos ($\pi n^2/N$) and $R_m \otimes$ Sin ($\pi n^2/N$) where $R_m$ is the magnitude of the real signal component sample stored at the $m$th of the shift register Sr1
$\otimes$ represents the convolution operation.

Figure 4A:
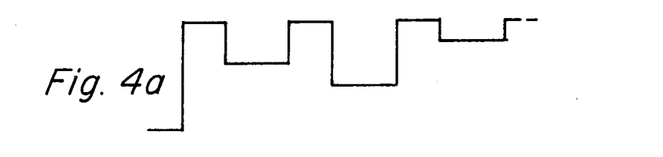
FIGS. 4a, b, c represent electrical waveforms explanatory of operation of parts of FIG. 3.
Figure 4B:
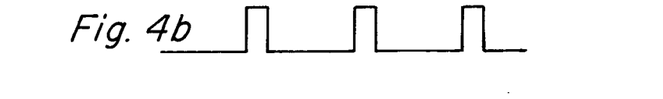
Figure 4C:
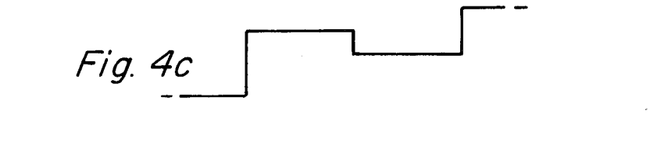

Output currents from the filters 20A and 20b are supplied to differential current integrators 30A and 30B, a representative output waveform from one of which is depicted in FIG. 4a. The current integrator outputs are amplified by respective current amplifiers 32A and 32B and fed to respective sample - and - hold circuits 34A and 34B respectively. The circuits 34A and 34B sample the outputs from amplifiers 34A and 34B under control of pulses from the clock pulse source CPS. Typical control pulses for a sample and hold circuit as well as a typical related output waveform are shown in FIGS. 4b and 4c respectively. The outputs from circuits 34A and 34B are fed to lines 36 and 38 respectively.

The signals on line 108 are inputted into shift register SR2, then processed by transversal filters 120 the outputs of which are passed over differential current integrators 130, current amplifiers 132 and samples and hold circuits 134 and 138 to lines 136 and 138. The circuit components associated with shift register SR2 are identical with those associated with shift register SR1 and are identified by corresponding references with a "100" prefix. The manner of processing the imaginary component signals ($Im$) transferred in parallel from the shift register SR2 also is identical with that of the real component signals described above and will not be repeated.

The signals from the M sample and hold circuits 34A and 134B are fed over the lines 36 and 138 as inputs to a different amplifier 40 while the signals from the M sample and hold circuits 34B and 134A are fed over lines 38 and 136 as inputs to the summation amplifier 140. The outputs from amplifiers 40 and 140 are squared by respective squaring circuits 42 and 142 the outputs of which are summed by a common amplifier 44, the output of which is the desired power density spectrum.

Thus, it will be appreciated that in accordance with the above described embodiment of the invention, a range gated pulse doppler processor utilizing Chirp-Z-Transform processing techniques has been realized utilizing CTD shift registers and CTD transversal filters.

Figure 5:
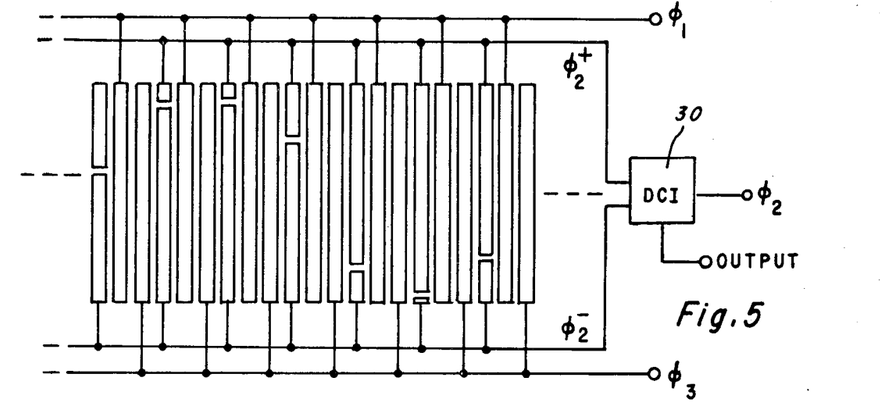
FIG. 5 represents one manner of realization of a CCD transverse filter suitable for use in FIG. 3.

A suitable realization of a CCD transversal filter is illustrated in FIG. 5. The structural features of the filter are the same as described with reference to FIG. 1 and will not be repeated, except for the electrode structure. It will be noted from FIG. 5 that the $\phi_2$ electrodes are each divided into two spaced portions with the envelope of the gaps defining a sine wave function contour for provision of the above described sine function weighting factor. The $\phi_2$ clock pulses are applied to the differential current integrator 30 which delivers $\phi_2^+$ and $\phi_2^-$ pulses to the upper and lower portions (as represented in FIG. 5) of the $\phi_2$ electrodes and produces an output signal corresponding to convolution of the input signal to the filter with the sine function weighting factor required for filters 20B and 120B.

By appropriate disposition of the gaps in the $\phi_2$ electrodes the cosine weighting function required for filters 20A and 120A could readily be realized.

Figure 6:
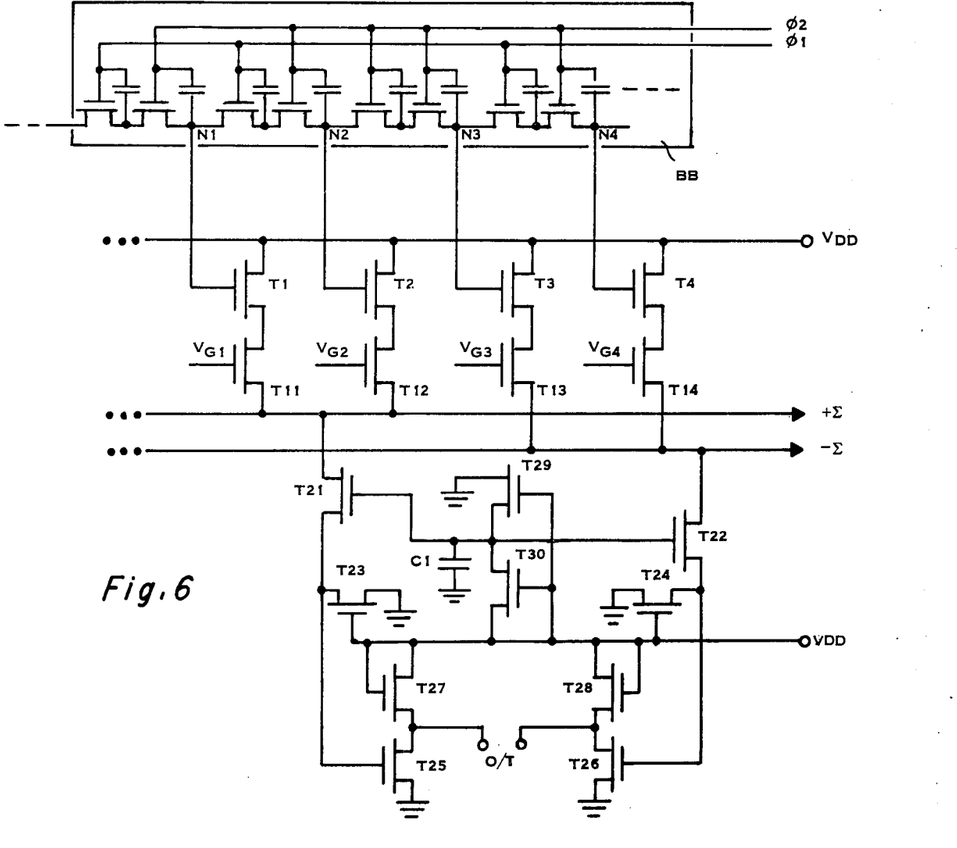
FIG. 6 represents one realization of a bucket brigade transverse filter suitable for incorporation in FIG. 3.

A suitable realization of a BB transversal filter is illustrated in FIG. 6. The structural features of the bucket brigade device BB are the same as described with reference to FIG. 2 and will not be repeated. FIG. 6 shows four storage bits of the bucket brigade filter BB, having associated data storage nodes N1, N2, N3, N4, respectively, connected to supply gate voltages to transistors T1, T2, T3 and T4 which form the drive stages for respective source follower IGFET amplifiers having IGFET load transistors T11, T12, T13 and T14 which respectively receive gate potentials VG1, VG2, VG3 and VG4 corresponding to time samples of the sine or cosine weighting function associated with the filter. As depicted in FIG. 6, the gate voltages VG1 and VG2 correspond with weighting functions associated with a negative half cycle of the weighting function. Alternatively, the gate voltages on the load transistors could be connected to the same supply, and weighting could be included by varying the length of the load transistors. The sources of transistors T11, T12 are connected to a positive weighting coefficient summation line $+\Sigma$ while the sources of transistors T13 and T14 are connected to a negative weighting coefficient summation line $-\Sigma$. Transistor pairs T21, T23 and T22, T24 serve as common gate transistor amplifiers for the $+\Sigma$ and $-\Sigma$ summation lines respectively. The gates of transistors T21 and T22 are clamped to a d.c. potential established by a voltage divider comprising transistors T29 and T30, and bypassed to ground by an MIS capacitor $C_1$. This voltage divider can also be implemented with diffused resistors or an additional external supply can be used. Transistors T25, T26, T27 and T28 form a linear IGFET differential amplifier with relative gain determined by the choices of width-length ratios for the IGFETS. This differential amplifier corresponds with the differential amplifier 30 illustrated in FIG. 3 and the output is taken from terminals O/T.

One particularly advantageous feature of this present invention is that the CTD shift registers SR1 and SR2 as well as the CTD transversal filters 20 and 120 may be provided on a common semiconductor chip SC as represented in FIG. 3, whether realized in CCD or BB format. Additionally, the current integrators 30, 130, amplifiers 32 and 132 and sample and hold circuits 34, 134 may readily be realized by insulated gate field effect transistor (IGFET) circuits also provided on the same semiconductor chip SC.

Since the number of range bins typically required for a radar system may vary between 50 and several thousand, a doppler processor chirp approach that can be expanded to accommodate any desired number of range bins is desirable. This approach can be effected, utilizing the present invention, by commutating the video returns to a desired number of chips SC as depicted in FIG. 3 for sorting into appropriate range bins and processing as described herein. By utilization of a processor according to the invention as described herein, significant reductions in size, weight and cost over conventional digital doppler processors may be achieved.

A further advantageous feature of the embodiment of the invention described with reference to FIG. 3 is that up-chirp weighting of the radar return signal samples is effected prior to clocking of the samples into the range buffer shift registers SR1 and SR2, instead of effecting such weighting on respective stored signal samples when transferred out in parallel from the range buffers, thereby providing considerable advantages in reduction of circuitry, leading to reduction in cost and complexity and increase in reliability of a processor embodying this aspect of the present invention.

Instead of using an up-chirp premultiplication signal of the form $e^{i\pi n^2/N}$, as described with reference to the weighting devices 16 and 106 in FIG. 3, other preweighting signals may be used. The techniques to be described in this respect have general applicability to signal processing using CZT techniques and are not restricted to range-doppler processors such as described with reference to FIG. 3.

Figure 7:
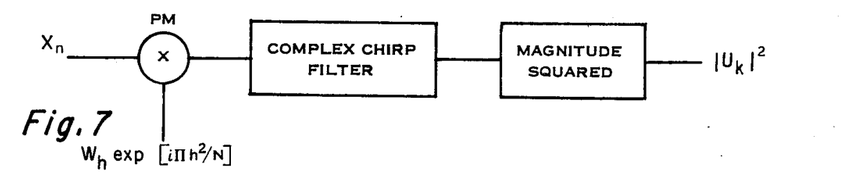
FIG. 7 depicts signal processing apparatus according to another more general aspect of the invention.

For example, with reference to FIG. 7, there is depicted a CZT processor including a premultiplier PM for effecting premultiplication or weighting of input signal samples $x_n$ prior to application to a complex CTD transversal filter designed to provide the desired transform respone characteristic. Such a filter may be realized using CCD or BBD filters (or combination thereof) with appropriate weighting factors provided, for example, in the manner described with reference to FIGS. 5 and 6 herein, the weighted signals being summed to generate an output signal, as known in the art.

In one example, the premultiplication signal may have the form $W_n e^{i\pi n^2/N}$ where $W_n$ is a weighting factor having an amplitude dependent on the signal sample concerned. This technique results in apodization or weighting to suppress side lobes in the weighting. Other preweighting techniques that may be used for side lobe suppression include, for example, Dolph-Chebyshev, Gaussian and Humming weighting. Such techniques do not result in a true DFT but a close approximation is obtained. With respect to Gaussian weighting, the time signal samples $x_n$ are amplitude weighted by a factor $W_n$ which follows a Gaussian distribution curve given by the expression $$W_n = \frac{1}{\sqrt{2\pi} \cdot \sigma} \, exp\left[\frac{-(n - N/2)^2}{2\sigma^2}\right]$$

where $\sigma$ is the standard deviation of the curve. The resulting time series is $$U_n = W_n x_n$$

and
$$U_k = \sum_n U_n \, e^{-i2\pi nk/N}$$
$$= \sum_n U_n \, x_n \, e^{-i2\pi nk/N}$$
$$= e^{-i\pi k^2/N} \sum_n (x_n \, U_n \, e^{-i\pi n^2/N}) e^{i\pi(n-k)^2/N}$$

Figure 8:
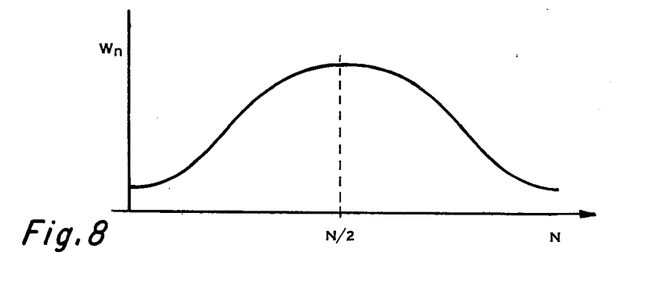
FIGS. 8, 9, 10 depict signal waveforms relating to FIG. 7.

In relation to CZT processing, preweighting can be accomplished by amplitude modulating the chirp signal so that, for example, in the case of Gaussian weighting the premultiplication signal applied to the multiplier PM would have an enevelope following a Gaussian curve, as depicted in FIG. 8.

The premultiplication signal, whether unweighted (i.e., constant amplitude) or weighted (i.e., amplitude modulated) may, in accordance with another aspect of the invention, be generated using a complex CTD transversal filter or as discussed with reference to FIG. 7. The filter weighting coefficients would be selected so that the filter has an impulse corresponding to the required preweighting signal, i.e., in order to generate preweighting signals impulses would be applied as inputs to the filter at appropriate intervals and the desired preweighting signal would then appear at the filter output.

Figure 9:
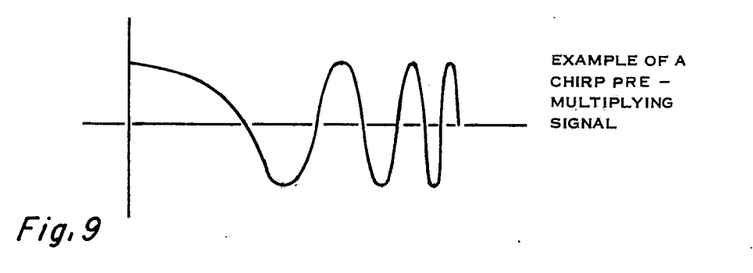
Figure 10:
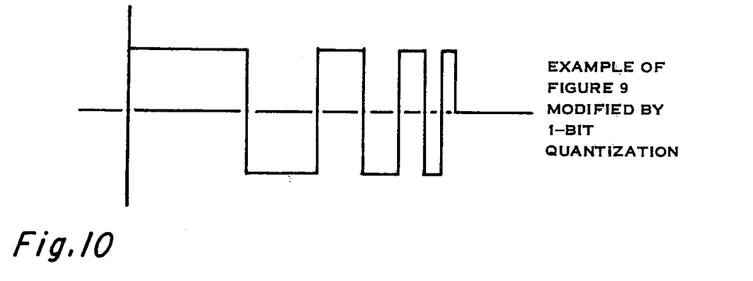

A further aspect of the invention, also applicable in general to signal processing involving CZT techniques, involves modification of an unweighted chirp preweighting signal (such as shown in FIG. 9) for application to the premultiplier PM shown in FIG. 7. The modified premultiplication signal is shown in FIG. 10 and comprises a 1-bit quantized version of the chirp signal shown in FIG. 9. This is advantageous since the premultiplication signal applied to the device PM then has a value of either +1 or −1 (wherein 1 represents some desired signal amplitude), thereby simplifying realization of the premultiplication process. The complex premultiplication signal may then be represented as $$P_n = S_{gn}\left(\cos\frac{\pi n^2}{N}\right) + i\, S_{gn}\left(\sin\frac{\pi n^2}{N}\right)$$

$$\text{where } S_{gn}(f) = \begin{cases} 1 & f>0 \\ 1 & f<0 \end{cases}$$

This multiplication signal may be implemented either by truncation of the tap weight coefficients to correspond with the waveform as shown in FIG. 10 or they may be samples of the true analog chirp waveform as shown in FIG. 9. Using this approach, a close approximation to a true DFT is obtained with considerable simplification of the processing system.

Additional description pertinent to filters such as described with reference to FIGS. 5 and 6 is contained in "Transversal Filtering Using Charge Transfer Devices," D. D. Buss, D. R. Collins, W. H. Bailey, and C. R. Reeves, *IEEE Journal of Solid State Circuits*, Apr. 1973, pages 138–146 and also in co-pending U.S. application Ser. No. 320,382 (now U.S. Pat. No. 3,877,056 issued Apr. 28, 1975) filed Jan. 2, 1973 by Walter H. Bailey for "Charge Transfer Device Signal Processing System" and assigned to the assignee of the present application, the disclosure of said application being incorporated herein by reference.

Specific embodiments of the present invention having been described in detail by way of example, it will be recognized that modifications thereof will be apparent to a person skilled in the art within the scope of the appended claims.

What is claimed is:

1. Doppler range processing apparatus including means for premultiplying time sampled radar signal returns to provide up-chirp multiplication of said time sampled signals;

charge transfer device shift register means having $N$ storage bits for storing respective up-chirp weighted samples of said radar return signals occuring during a pulse repetition interval;

for each bit of said shift register means, first and second charge transfer device chirp Z-transform filters;

transfer means for transferring signals stored in the bits of said shift register as inputs to the respective first and second chirp filters for each respective bit;

said first chirp filters being adapted to provide in-phase weighting of said input signals thereto;

said second chirp filters being adapted to provide quadrature-phase weighting of said input signals thereto;

means connecting said filter outputs to means for summing and squaring weighted signal outputs from said filters.

2. Apparatus according to claim 1, wherein said charge transfer device shift register means and said chirp filters are all incorporated into a single semiconductor substrate.

3. Apparatus according to claim 1, wherein said premultiplication means is adapted to weight said time-sampled signal returns according to a function $e^{i\pi n^2/N}$ where $n$ is an integer representing the $n^{th}$ sampled signal return and $N$ is the total number of sampled signal returns.

4. Apparatus according to claim 1, wherein said premultiplication means is adapted to weight said time-sampled signal returns according to a function $W_n e^{i\pi n^2/N}$, where $W_n$ is a weighting factor dependent on $n$; $n$ is an integer representing the $n^{th}$ sampled signal return, and $N$ is the total number of sampled signal returns.

5. Apparatus according to claim 1, wherein said premultiplication means is adapted to weight said time sampled signal returns with an amplitude modulated weighting signal.

6. Doppler radar processing apparatus including:

means for premultiplying time sampled radar signal returns to provide up-chirp multiplication of said time sampled signals and producing first and second pre-weighted signal sample outputs, said first outputs corresponding with in-phase signal components and said second outputs corresponding with quadrature-phase signal components;

first charge transfer device shift register means connected to receive said second weighted signal outputs from said pre-weighting means;

for each bit of said first and second shift register means individual first and second charge transfer device chirp correlation filter means;

means for transferring signals stored in the bits of said first shift register means to the first and second chirp correlation filter means for each respective bit of said first shift register means;

means for transferring signals stored in the bits of said second shift register means to the first and second chirp correlation filter means for each respective bit of said second shift register means;

said first chirp correlation filter means adapted to weight input signals thereto with an in-phase weighting factor;

said second chirp correlation filter means adapted to weight input signals thereto according to a quadrature-phase weighting coefficient;

first means for summing and squaring the outputs from the first chirp correlation filters of said first shift register means and of said second chirp correlation filter outputs of said second shift register means;

second means for summing and squaring the outputs from the first chirp correlation filter means of said second shift register means and of the second chirp correlation filter outputs of said first shift register means.

7. Apparatus according to claim 6, further including means for summing the outputs of said first and second summing and squaring means.

8. Apparatus according to claim 7, wherein said first and second shift register means together with said first and second charge transfer device chirp correlation filter means all are provided on a common semiconductor substrate.

9. Apparatus according to claim 8, wherein said charge transfer device shift register means and said charge transfer device chirp correlation filter means all comprise charge coupled devices.

10. Apparatus according to claim 6, further including for each said chirp correlation filter means, differential current integration means for receiving outputs from said filter menas; and means for sampling and temporarily storing the output from said differential current integration means.

11. Apparatus according to claim 6, wherein said pre-weighting means includes first signal mixer means for receiving radar return video signals and a reference signal, and for providing time sampled outputs from said first mixing means;
  second signal mixing means for receiving said radar return video signals and said reference signals phase-shifted by 90°, and for producing time-sampled outputs from said second mixer means;
  third signal means connected for receiving said time sampled outputs from said first mixing means and an in-phase up-chirp weighting signal;
  fourth signal mixing means for receiving time-sampled outputs from said second mixer means and a quadrature-phase up-chirp weighting signal;
  fifth signal mixing means for receiving said time-sampled outputs from said first mixing means and a quadrature-phase up-chirp weighting signal;
  sixth signal mixing means for receiving said time-sampled outputs from said second signal mixing means and an in-phase up-chirp weighting signal;
  difference amplifier means connected to receive outputs from said third and fourth signal mixing means;
  summation amplifier means connected to receive inputs from said fifth and sixth signal mixing means;
  means connecting said difference amplifier output to apply inputs to said first shift register means and means connecting said summation amplifier output to apply inputs to said second shift register means.

12. Apparatus according to claim 11, wherein said up-chirp weighting signals have a constant amplitude.

13. Apparatus according to claim 11, wherein said up-chirp weighting signals are amplitude modulated to provide apodization of the weighted signals.

* * * * *